United States Patent [19]

Nemit et al.

[11] 4,161,705

[45] Jul. 17, 1979

[54] LOW LEVEL CONTROLLABLE RADIO FREQUENCY PHASE SHIFTER

[75] Inventors: Jeffrey T. Nemit, Canoga Park; Ronald I. Wolfson, Northridge, both of Calif.

[73] Assignee: International Telephone and Telegraph Corporation, New York, N.Y.

[21] Appl. No.: 861,524

[22] Filed: Dec. 19, 1977

[51] Int. Cl.² .................. H03H 7/20; H03H 7/22; H01P 1/18

[52] U.S. Cl. .................................... 333/156; 333/164

[58] Field of Search ............... 333/31 R, 28 R, 31 A, 333/11, 18, 1, 2, 3, 4, 5, 6, 7 R, 10, 9, 29; 343/854, 858, 754

[56] References Cited

U.S. PATENT DOCUMENTS

| 3,323,080 | 5/1967 | Schwelb et al. ............... 333/11 |
| 3,354,459 | 11/1967 | Schwartz et al. ............ 343/854 X |
| 3,440,570 | 4/1969 | Kasper ......................... 333/31 R |
| 3,458,836 | 7/1969 | Engelbrecht .................. 333/854 X |

*Primary Examiner*—Alfred E. Smith
*Assistant Examiner*—Marvin Nussbaum
*Attorney, Agent, or Firm*—William T. O'Neil

[57] ABSTRACT

The invention involves in-phase power splitting from an input into separate pairs of paralleled input variable circuits which may be linear amplifiers or linear controlled attenuators. The outputs of these circuits feed the input branches of a pair of 180° hybrid circuits, the outputs of those hybrids providing the inputs of a 3 db quadrature coupler. An output of this coupler then provides the overall output which is shifted in phase with respect to the original input as a function of the gain control signal applied differentially between the variable circuits of the aforementioned pairs as the cosine of the desired phase angle in respect to the first pair of circuits and in accordance with the sine of the desired phase angle at the control terminals of the second pair of circuits.

10 Claims, 3 Drawing Figures

LOW LEVEL CONTROLLABLE RADIO FREQUENCY PHASE SHIFTER

BACKGROUND OF THE INVENTION

The invention relates to electronically controllable radio frequency phase shifters.

In the prior art, electronically controlled phase shifters have been applied, particularly in radar systems. In fact, the evolution of phased array radar has been made possible, at least in part, by the development of electronically controlled inertialess phase shifters. Such phase shifters are now extensively employed in phase-scanning systems. Both the existing types of phase shifters and the radar systems themselves are extensively described in the technical and patent literature. The text, *RADAR HANDBOOK*, by Merill I. Skolnick (McGraw-Hill Book Company, 1970), provides a background in respect to such systems, particularly in Chapter 11 thereof. Chapter 12 of the same handbook is devoted to "phase shifters for arrays", the state of that art being therein summarized. It will be noted therein that the types of phase shifters known and used in the radar art have taken several forms. One, the so-called "twin-slab" phase shifter, employs a ferrimagnetic toroid within a waveguide with control magnetizing (drive) means associated therewith. Such phase shifters can be built in purely analog form or in successive sections of properly scaled phase shift significances so that they may be separately controlled in accordance with a digital control format. Other ferrimagnetic type phase shifters include the so-called Reggia-Spencer configuration and various forms of strip-line combinations with ferrimagnetic material associated therewith. Still further, strip-transmission-line slow-wave-structure phase shifters are known and discussed in the referenced handbook. Other forms and variations of the electronically controlled phase shifter genera are also described in Chapter 12 of the aforementioned handbook.

It is generally conceded that high-power phase shifters are inherently difficult to construct, are expensive, and exact penalties in terms of size, weight and system inefficiency.

Another type of phase shifter is the so-called diode and strip-line digital type. One form of such a device is described in U.S. Pat. No. 4,044,360. That device includes an additional feature making the phase shifter retro-directive, as well as forward transmissive, selectively.

The manner in which the present invention improves upon the shortcomings of many of the prior art approaches to the problem of electronically controlled RF phase shifting will be evident as this description proceeds.

SUMMARY

In accordance with the aforementioned state of the prior art, it may be said to have been the general objective of the present invention to produce an inexpensive, easily-instrumented, low-level, controllable RF phase shifter which may be used with an RF amplifier, if necessary, to provide higher power levels, while still maintaining relative simplicity and low cost.

According to the invention, the device includes two pairs of controllable circuits which are either amplifiers with controllable gain, or signal controlled attenuators. The first pair is fed with inputs paralleled from one leg of an in-phase power splitter at the input terminal, and the other pair is fed from the second leg of the same power splitter. The outputs of one pair of these circuits are fed discretely to the input legs of a four-port 180° hybrid, the difference port of which connects to a 3 db quadrature coupler. The other input of the same quadrature coupler is fed from the difference port of the second 180° hybrid, similarly associated with the second pair of controllable circuits. The hybrid sum ports and one output leg of the 3 db quadrature coupler are terminated, the other leg of the quadrature coupler providing the overall output. If the gain (or attenuation) of the circuit pairs are controlled differentially as a function of the sine of the desired phase shift for one pair and as the cosine of that angle for the other pair, and if the gain or attenuation control characteristic of the circuits is essentially linear, then the output phase is a substantially linear function of the input RF phase, with the gain control signals being the independent variable.

A more detailed description of an embodiment employing linear solid state amplifiers (such as double-gate FET devices) will be described and, in the other embodiment, solid state balanced mixers are used as controlled attenuators with compensating amplification.

DETAIL DESCRIPTION

Figure 1:
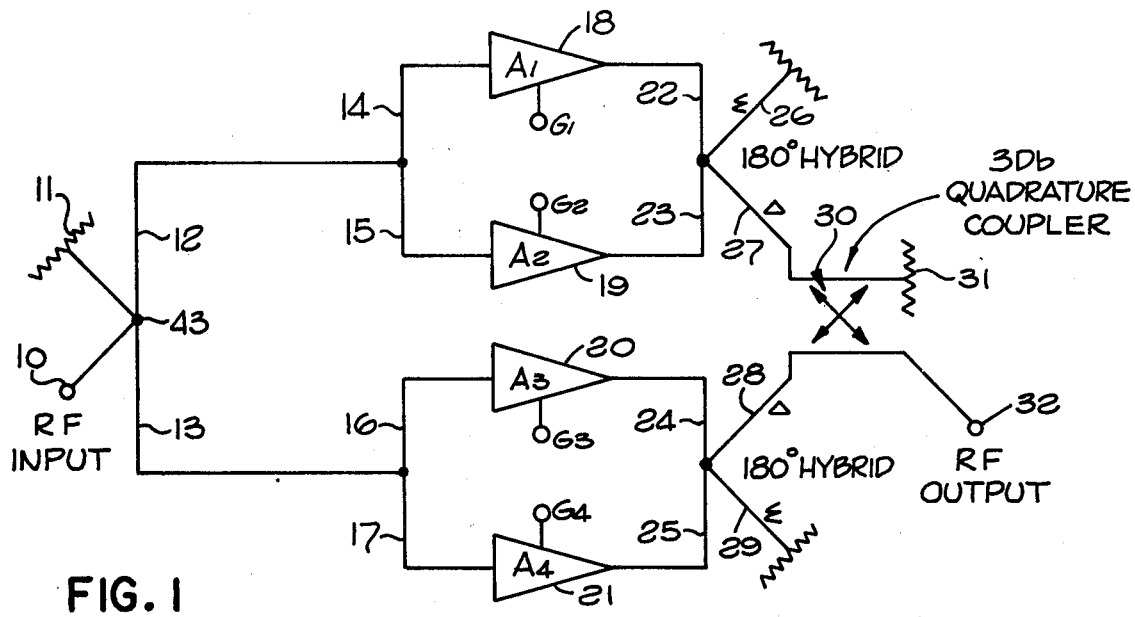
FIG. 1 is a schematic block diagram of a first embodiment according to the invention, utilizing gain-controllable amplifiers.

Referring now to FIG. 1, it will be noted that terminals 10 and 32 are the RF input and output terminals of the device, respectively. An in-phase power-splitter, represented by the junction 43, is connected on one input port to the aforementioned terminal 10 and the other input port thereof is connected to a termination 11. Two output ports 12 and 13 provide equal fractions of the input power on 10 to two pairs of controllable amplifiers. Output 12 of the power splitter is fed to amplifiers A1 and A2 (also identified as 18 and 19, respectively) at input leads 14 and 15, respectively. Similarly, the signal from the in-phase power splitter on lead 13 is supplied via leads 16 and 17 to the inputs of amplifiers 20 and 21, respectively.

The outputs of amplifiers 18, 19, 20 and 21 comprise leads 22, 23, 24 and 25, respectively. Leads 22 and 23 comprise the input ports of a 180° hybrid, the sum and difference outputs of which are 26 and 27, respectively. Similarly, 24 and 25 comprise the input ports of a second 180° hybrid, the difference and sum outputs of which are 28 and 29, respectively. A 3 db quadrature coupler 30 receives the two outputs 27 and 28, while the sum outputs of the two 180° hybrids (namely, 26 and 29) are suitably terminated, and the other output port 32 providing the overall circuit output.

A typical linear amplifier circuit suitable for amplifiers 18-21 is the so-called dual-gate, metal-oxide-semiconductor, field-effect transistor (MOS/FET). Such a device is described in the technical literature, for example, in the RCA TRANSISTOR AND DIODE MANUAL, Technical Series SC-15 (Radio Corporation of America, 1971). Such field-effect transistors are analogous to multi-grid electron tubes and, in that respect, provide relatively high input impedance. Accordingly, the input impedances 14, 15, 16 and 17 do not heavily load the signal source impedances; thus the input phase references are accurately maintained.

Ordinarily, the FET of the type described has first and second gates, the first gate normally being identified as the one with the highest forward trans-conductance and, as such, would preferably be the one used as the RF input; i.e., connected to the leads 14, 15, 16 and 17. Gate 2 in each case may be used as the gain control terminal, these being identified in FIG. 1 as G1, G2, G3 and G4 for the amplifiers 18, 19, 20 and 21, respectively.

The MOS/FET described is basically a linear device, the control signal applied at any of the terminals G1 through G4 producing a proportional gain change in the corresponding amplifier. In FIG. 1, the output of each 180° hybrid into the 3 db quadrature coupler is proportional to the differential gain of the corresponding pair of amplifiers coupled to that hybrid.

If the 3 db quadrature coupler 30 has an input at 27 identified as $V_Q$ and an input at 28 identified as $V_I$ (so identified because these would normally be the quadrature and direct ports), then these signals $V_Q$ and $V_I$ can be identified as follows:

$$V_Q = V_{in} K (G_1-G_2), \text{ and}$$

$$V_I = V_{in} K (G_3-G_4),$$

where Vin is the signal at input 10 and K is a proportionality constant.

To make the circuit function as a phase-shifter, the differential gain $G_1-G_2$ is set equal to cosine $\phi$, where $\phi$ is the desired phase shift. Similarly $G_3-G_4$ is set equal to sine $\phi$. The hybrid output terminals 27 and 28 are then combined in 30 to synthesize the desired phase shift with constant amplitude. Thus:

$$\left. \begin{array}{l} V_Q = V_{in} K \text{ cosine } \Phi \\ V_I = V_{in} K \text{ sine } \Phi \end{array} \right\} \longrightarrow$$

$$V_{out} = \sqrt{2} \; V_{in} K \text{ (cosine } \Phi + j \text{ sine } \Phi\text{)}$$
$$= \sqrt{2} \; V_{in} K \, e^{j\Phi}$$

Figure 3:
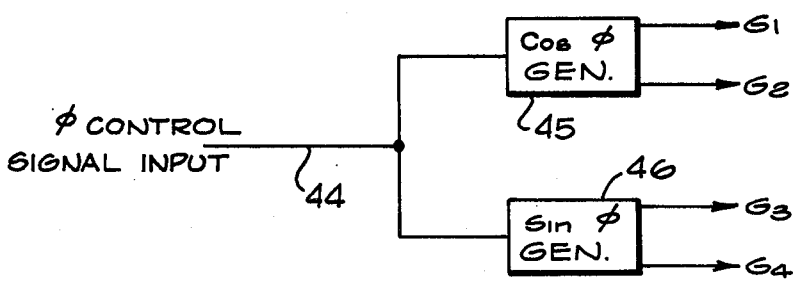
FIG. 3 is a schematic block diagram showing structure for use of a single independent variable control signal used to develop sine and cosine control signals for application to the embodiments of FIGS. 1 and 2.

Looking ahead to FIG. 3, the general configuration of apparatus supplying the cosine $\phi$ and sine $\phi$ control signals, each as a differential pair, is seen in 45 and 46, respectively. Thus, G1 and G2 and G3 and G4 each form differential signal couples and are applied as indicated in FIG. 1.

The nature of the function generators 45 and 46 will be well understood by those skilled in this art. Various forms of analog computer techniques are possible for this purpose, both 45 and 46 being responsive to a single phase control signal input at 44.

It will, of course, be realized that the configuration of FIG. 3 may also be digitally controlled, i.e., the signal on 44 may be a digital code, and 45 and 46 need then only be "read-only" memories providing the complementary outputs represented by G1 versus G2 and G3 versus G4.

Figure 2:
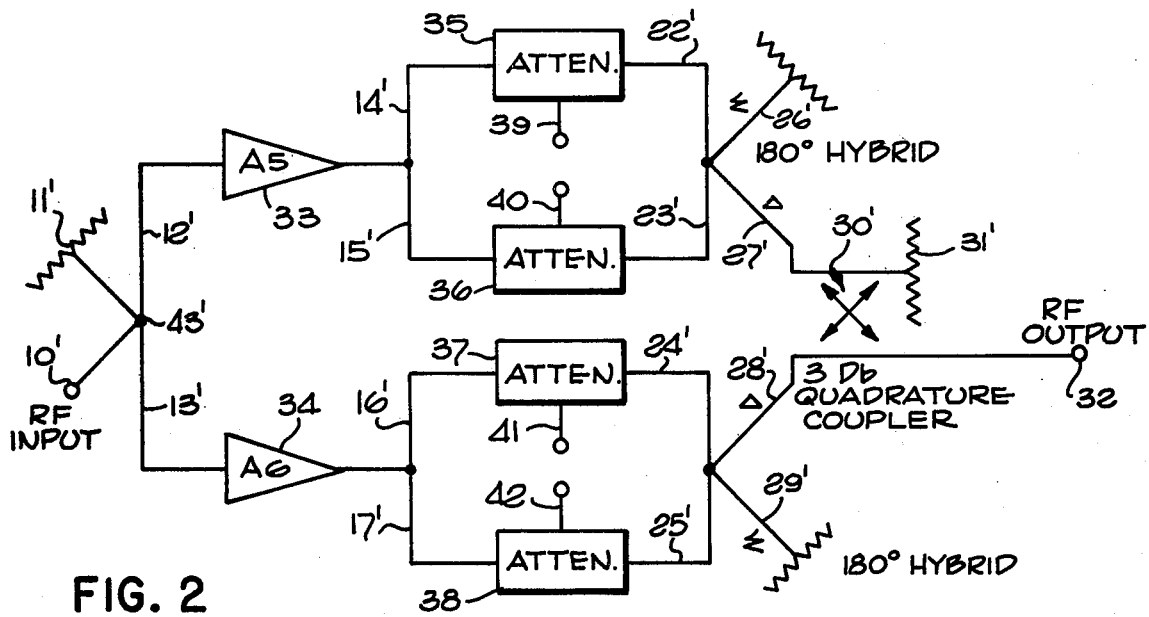
FIG. 2 is a second embodiment employing controllable attenuators in lieu of the amplifiers of FIG. 1.

Referring now to FIG. 2, a second embodiment is illustrated in which the controlled amplifiers 18–21 are replaced by controlled attenuators 35, 36, 37 and 38. These have control terminals 39, 40, 41 and 42, respectively, and may be any of several known types of signal controlled attenuators. Various solid state circuits are available which perform this function, one of these being the so-called diode balanced mixer. Such devices are variously sold as packaged units, one of these being available from Mini-Circuits Laboratories, Brooklyn, N.Y. Controlled attenuators 35–38 can be instrumented accordingly.

In FIG. 2, the signal leads and component reference numerals which are substantially identical with FIG. 1 are identified by the same numeral with prime. Amplifiers 33 and 34 (also identified as A5 and A6, respectively) are shown in the signal leads 12' and 13' to provide gain for offsetting the loss in the attenuators 35, 36, 37 and 38. Such auxiliary amplification may or may not be necessary depending upon the signal levels involved and the particular application contemplated. The circuit of FIG. 3 is equally applicable; in this case, the outputs of 45 G1 and G2 are applied to 39 and 40, respectively, whereas the outputs of 46 (namely, G3 and G4) are applied to 41 and 42, respectively. The relationship between the signal input on 10' and the output on 32' is substantially the same as described in connection with FIG. 1 except for proportionality factors; i.e., the phase shift provided is a linear function of the control signal at 44.

In either described configuration, the device can be made very small and, in view of the high impedance of the MOS/FET gates, RF driving and control power requirements are both small.

The circuit will provide precise analog phase control or, in the digital control signal case, will provide a faithful output phase dictated by 45 and 46, where these circuits are "read-only" memories, in response to a digital control signal on 44.

Higher power levels can be provided by additional RF amplification following terminals 32 and 32', as required. Current duaL-gate FETs, as contemplated for the preferred implementation, have an upper operating frequency on the order of 500 to 700 megahertz; however, the principle of operation for the phase shifter, according to the inventive concept, is applicable to other frequency ranges, either higher or low, depending upon the type of gain control device employed.

Other variations on the specific instrumentation, according to the invention, will suggest themselves to those skilled in this art. Accordingly, it is not intended that the drawings and this description should be considered as limiting the scope of the invention. The drawings and description are to be regarded as typical and illustrative only.

What is claimed is:

1. A signal controlled radio frequency phase shifter comprising:

first means responsive to an RF signal input for in-phase division of said RF signal into two branches substantially equally;

second means comprising first, second, third and fourth circuits each having an RF input terminal and an amplitude control terminal and each providing an RF output at a corresponding output terminal at an amplitude which is a function of a parameter of said control signal applied to the corresponding control terminal, said first and second circuits having their RF input terminals connected in parallel to one of said first means branches, said third and fourth circuits having their inputs connected in parallel to the other of said first means branches, said control signals being applied differentially in a first control signal pair to said first and second circuits and differentially in a second control signal pair to said third and fourth circuits;

third means comprising first and second 180° hybrids each having four ports including a pair of input ports and sum and difference output ports, said input ports of said first hybrid being discretely connected to said first and second circuit outputs of said second means and said input ports of said second hybrid being discretely connected to said third and fourth circuit outputs of said second means;

and fourth means comprising a quadrature coupler having at least three terminals including an output terminal and first and second quadrature related terminals, said coupler first quadrature terminal being connected to the difference output port of said first hybrid coupler and said coupler second quadrature terminal being connected to the difference output port of said second hybrid coupler, said coupler output terminal providing an RF signal having a phase with respect to said first means RF input which is a function of said control signals applied to said second means amplitude control terminals.

2. Apparatus according to claim 1 in which said second means circuits are further defined as each providing an RF output which is a linear function of said control signal and in which said first and second circuits are controlled differentially at their amplitude control terminals by said first control signal pair and said third and fourth circuits are controlled differentially at their amplitude control terminals by said second control signal pair, the algebraic difference of the signals of said first control signal pair being proportional to cosine $\phi$, and the algebraic difference of the signals of said second control signal pair being proportional to sine $\phi$, where $\phi$ is the angular phase shift to be obtained at said fourth means output terminal.

3. Apparatus according to claim 1 in which said first through fourth circuits are gain controllable amplifiers.

4. Apparatus according to claim 2 in which said first through fourth circuits are gain controllable amplifiers.

5. Apparatus according to claim 4 in which said gain controllable amplifiers each comprise a dual gate FET solid state device and said amplitude control terminals are gate terminals of corresponding ones of said FET devices.

6. Apparatus according to claim 2 in which said second means circuits comprise controllable attenuators.

7. Apparatus according to claim 6 in which means are provided between said first means and the inputs of said controllable attenuators for providing substantially constant RF signal amplification to compensate for loss of signal at the outputs of said attenuators.

8. Apparatus according to claim 5 in which said FET devices have first and second gate terminals, said first gate terminal providing the greater effective transconductance in said device, said first gate being connected as the terminal responsive to said first means, and said second gate being said amplitude control terminals.

9. Apparatus according to claim 8 in which said FET devices are further defined as MOS/FET transistors.

10. Apparatus according to claim 6 in which said controllable attenuators are solid state current-controlled attenuators.

* * * * *